United States Patent [19]

Henley et al.

[11] 4,032,819
[45] June 28, 1977

[54] RASTER CENTERING CIRCUIT

[75] Inventors: Michael Lee Henley, Indianapolis; Lawrence Edward Smith, Noblesville, both of Ind.

[73] Assignee: RCA Corporation, New York, N.Y.

[22] Filed: July 30, 1975

[21] Appl. No.: 600,511

[52] U.S. Cl. .............................. 315/398; 315/368; 315/13 C
[51] Int. Cl.² ...................................... H01J 29/54
[58] Field of Search ................. 315/13 C, 368, 398

[56] References Cited
UNITED STATES PATENTS

| | | | |
|---|---|---|---|
| 3,510,723 | 5/1970 | Dumas | 315/398 |
| 3,849,696 | 11/1974 | Peter et al. | 315/13 C |
| 3,882,350 | 5/1975 | Hall | 315/13 C |

Primary Examiner—Maynard R. Wilbur
Assistant Examiner—T. M. Blum
Attorney, Agent, or Firm—Eugene M. Whitacre; Paul J. Rasmussen; Joseph Laks

[57] ABSTRACT

A convergence circuit coupled in parallel with a deflection winding are AC coupled to an output terminal of a deflection amplifier. Rectifiers in the convergence circuit are poled such that the deflection amplifier output current is assymmetrically loaded during the trace portion of each deflection cycle, causing a net direct current of a first polarity through the deflection winding which off-centers the raster. A direct current path coupled in shunt with the yoke coupling capacitor permits conduction of a direct current of a second polarity through the deflection winding for controlling the centering of the raster.

3 Claims, 1 Drawing Figure

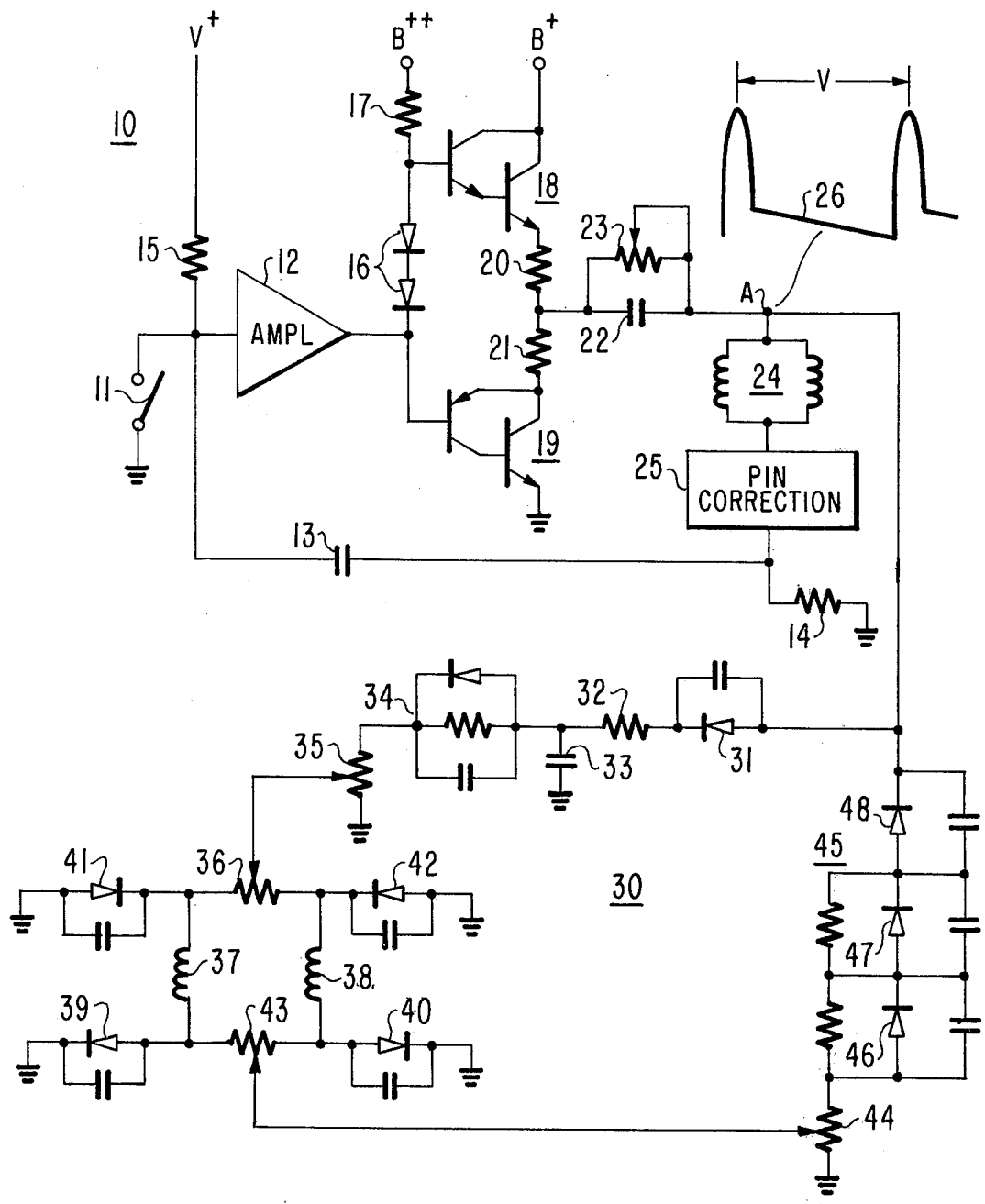

RASTER CENTERING CIRCUIT

BACKGROUND OF THE INVENTION

This invention relates to a raster centering circuit for a deflection system such as in a television receiver.

Frequently, relative misalignment of the components comprising a television display system such as the picture tube envelope, electron gun assembly and the deflection yoke cause the scanned raster to be not centered on the viewing screen. Generally, two alternatives are available to compensate for this condition. First, the raster may be enlarged by increasing the peak power of the deflection current to create an overscan condition. With an overscan condition, relatively small offset conditions of the raster will not be noticed as the entire viewing screen displays a picture. The main disadvantage of utilizing overscan to correct a centering problem is the additional power consumption by the deflection circuit and its components. In effect, any overscan represents a waste of power in that the overscan portion of the raster is not viewable.

The second alternative is to provide means for centering the raster by applying a direct current through the vertical or horizontal or both of the deflection windings to thereby shift the raster as is well-known in the art. Obviously, the least complex and least energy consuming arrangement for providing a D.C. centering current is desirable in any particular deflection circuit configuration.

SUMMARY OF THE INVENTION

A raster centering circuit includes a deflection amplifier and a coupling capacitor and a deflection winding serially coupled to an output terminal of said amplifier. A convergence circuit of the type conducting unequal currents during the trace interval of each deflection cycle is coupled in parallel with the deflection winding. A direct current circuit is coupled in parallel with the coupling capacitor for controlling the net direct current in the deflection winding during each trace interval.

A more detailed description of the invention is given in the following description and accompanying drawing of which the sole FIGURE is a block and schematic circuit diagram of a deflection system embodying a raster centering circuit in accordance with the invention.

DESCRIPTION OF THE INVENTION

A vertical deflection system 10 includes a switching stage 11 activated once each deflection cycle by a source of synchronizing signals, not shown, to allow charging of capacitor 13 from the V+ supply through resistor 15 and resistor 14 to ground to form a sawtooth waveform defining the tract interval of each deflection cycle. In the closed position switch 11 permits discharging of capacitor 13 through switch 11 and resistor 14 to initiate the retrace interval of each deflection cycle. A sawtooth waveform formed by the charging of capacitor 13 is coupled through an amplifier, or driver, stage 12 to be coupled to a first transistor output stage 19 and through two level shifting diodes 16 and to a second output stage 18. Resistor 17 coupled between B++ and diode 16 biases the bases of the output stages 18 and 19.

Output stages 18 and 19 are serially coupled to each other through serially coupled resistors 20 and 21 and are energized by their connection to operating potential B+ and ground. In the illustrated embodiment, output stages 18 and 19 form a conventional quasi-complementary push-pull amplifier. Output stage 18 conducts during the positive sawtooth portion of each deflection cycle and output stage 19 conducts during the negative sawtooth portion of each deflection cycle. The junction of current limiting resistors 20 and 21 forms the deflection amplifier output terminal which is coupled through a yoke coupling capacitor 22 to a terminal A. A variable resistance 23 is coupled in parallel with coupling capacitor 22 for purposes to be described subsequently. From terminal A a pair of vertical deflection windings 24 coupled in parallel with each other are serially coupled with a suitable pincushion correction network 25, and a feedback resistor 14 to ground.

During operation of deflection system 10, when the sawtooth waveform coupled to the output stages is positive, current is conducted from the B+ supply through output stage 18, resistor 20, capacitor 22, deflection windings 24, pincushion network 25 and feedback resistor 14 to ground, charging capacitor 22 positive on its left terminal with respect to it right terminal. During the second half of the trace interval when the sawtooth waveform coupled to the output stages is negative, output stage 18 stops conducting and output stage 19 conducts, providing a path for deflection yoke current from ground up through resistor 14, pincushion network 25, deflection windings 24, capacitor 22, resistor 21 and output stage 19, to ground slightly discharging capacitor 22. This operation provides a sawtooth deflection current of a first polarity through deflection windings 34 during the first half of the trace interval and a deflection current of a second polarity through the deflection windings during the second half of the trace interval. During the retrace interval, the energy stored in deflection windings 24 reverses the deflection current in a relatively short time dependent largely on the L/R ratio of deflection windings 24. This causes a relatively high positive retrace voltage pulse to be formed at terminal A as illustrated by waveform 26.

Also coupled to terminal A is a convergence circuit indicated generally by the reference numeral 30. In most respects this convergence circuit is similar to the convergence circuit disclosed in U.S. Pat. No. 3,849,696, issued to Rene Peter, et al.

During the retrace interval diode 31 becomes forward biased by the retrace pulse developed across windings 24 and conducts current through resistor 32 to charge capacitor 33 positive relative to ground. Following the retrace interval during the first half of scan, diode 31 only conducts when the potential across capacitor 33 becomes less than the voltage at point A minus a diode drop. Capacitor 33 then discharges through network 34 and potentiometers 35 and 36 to form a sawtooth waveform which is integrated into a parabolic current by convergence windings 37 and 38 and returned to ground through respective diodes 39 and 40. The sawtooth voltage is integrated by the inductance of the convergence windings to form a parabolic convergence current through windings 37 and 38.

At approximately the middle of the trace interval the negative going sawtooth voltage of waveform 26 forward biases network 45 including serially coupled diodes 46, 47 and 48 such that convergence correction current now flows from ground through diodes 41 and 42 through respective convergence coil windings 37 and 38, potentiometer 43, potentiometer 44, through network 45 back to terminal A.

In convergence circuit 30 potentiometer 35 controls the amplitude of the convergence current during the top half of the raster and potentiometer 36 differentially adjusts the current through windings 37 and 38. During the second portion of the trace interval potentiometer 44 controls the amplitude of the convergence correction current in the bottom half of the raster and potentiometer 43 differentially adjusts this current through convergence windings 37 and 38.

It is noted that capacitor 33 is charged primarily during the retrace interval and only a small amount of scanning current is diverted through diode 31 during most of the first half of each trace interval because diode 31 is forward biased only part of the first half of the trace interval as described above. However, once the waveform 26 voltage has become negative enough, at a point slightly before the center of the trace interval to forward bias network 45, then diodes 46, 47 and 48 conduct during the remaining portion of the second half of the trace interval, providing a shunt rectifying path for deflection current which diverts deflection current from windings 24. In the illustrated circuit, diode 31 loads the deflection circuit more than diodes 46-48. Thus, there is less current in windings 24 during the first half of the trace interval relative to the second half, resulting in a net negative flow of current through deflection windings 24 during the trace interval which shifts the raster downward on the viewing screen of the television picture tube.

To correct this situation potentiometer 23 comprises a direct current path in parallel with capacitor 22. Capacitor 22 has a relatively large value and hence the voltage across it changes only a relatively small amount of its full charge during each deflection cycle. Hence, capacitor 22 effectively acts as a battery with its positive terminal on the left hand side relative to its right hand side. Potentiometer 23 provides a direct current path across capacitor 22 which discharges capacitor 22 to a degree determined by the setting of potentiometer 23. This direct current path inserts a positive direct current component through windings 24. This amount of current can be varied as desired to buck the negative direct current flow through windings 24 such that there is no shift of the raster caused by direct current through the windings. At the same time, in addition to correcting an off-center condition caused by the assymetrical loading of the convergence circuit during the trace interval, potentiometer 23 may be further adjusted to control the net direct current flow through deflection windings 24 to correct an off-center raster condition caused by a relative misalignment such as may exist between the deflection yoke and the picture tube and by purposefully introducing a raster shift in either direction.

In the illustrated embodiment, the assymetrical loading of the convergence circuit is caused by placing the convergence circuit in parallel with the deflection windings. Thus, the described embodiment utilizes the full voltage developed across the deflection windings by placing the convergence circuit 30 in parallel with the deflection windings and the resultant assymetrical loading of the described convergence circuit in conjunction with the direct current path through resistor 23 in parallel with coupling capacitor 22 is utilized to provide an efficient and simple raster centering circuit.

What is claimed is:
1. A raster centering circuit, comprising:
   a deflection amplifier;
   a coupling capacitor and a deflection winding serially coupled to an output terminal of said amplifier, said amplifier operated such that there is always a direct current voltage of a first fixed polarity across said coupling capacitor;
   a convergence circuit including oppositely poled unidirectional current conducting devices coupled in parallel with said deflection winding, loading said deflection winding such that there is a direct current of a first polarity in said winding during each trace portion of a deflection cycle; and
   a direct current circuit coupled in parallel with said coupling capacitor and responsive to said direct current voltage of a first fixed polarity for controlling a direct current of a second polarity in said winding thereby controlling the net direct current in said winding.

2. A raster centering circuit according to claim 1 wherein said convergence circuit includes a first unidirectional current conducting device poled for conducting deflection current primarily during the retrace period of each deflection cycle and a second unidirectional current conducting device poled for conducting deflection current primarily during a first one-half of the trace interval of each deflection cycle, said second device rectifying said deflection current for causing said direct current of said first polarity in said winding during said trace interval.

3. A raster centering circuit according to claim 2 wherein said direct current circuit includes a resistor in parallel with said coupling capacitor across which resistor said direct current voltage of a first fixed polarity is impressed for controlling said direct current of a second polarity in said deflection winding for opposing said direct current of a first polarity for controlling the net direct current in said deflection winding during the trace interval of each deflection cycle.

* * * * *